US009666590B2

(12) United States Patent
Chien et al.

(10) Patent No.: US 9,666,590 B2
(45) Date of Patent: May 30, 2017

(54) HIGH STACK 3D MEMORY AND METHOD OF MAKING

(71) Applicant: SanDisk Technologies, Inc., Plano, TX (US)

(72) Inventors: Henry Chien, San Jose, CA (US); Jayavel Pachamuthu, San Jose, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 281 days.

(21) Appl. No.: 14/495,085

(22) Filed: Sep. 24, 2014

(65) Prior Publication Data
US 2016/0086964 A1    Mar. 24, 2016

(51) Int. Cl.
*H01L 27/115* (2006.01)
*H01L 27/11556* (2017.01)
*H01L 27/11582* (2017.01)
*H01L 27/11519* (2017.01)
*H01L 27/11565* (2017.01)

(52) U.S. Cl.
CPC .. *H01L 27/11556* (2013.01); *H01L 27/11582* (2013.01); *H01L 27/11519* (2013.01); *H01L 27/11565* (2013.01)

(58) Field of Classification Search
CPC combination set(s) only.
See application file for complete search history.

(56) References Cited

U.S. PATENT DOCUMENTS

| 5,387,530 A | 2/1995 | Doyle et al. |
| 5,915,167 A | 6/1999 | Leedy |
| 5,972,722 A | 10/1999 | Visokay et al. |

(Continued)

FOREIGN PATENT DOCUMENTS

| KR | 10-2009-0001377 | 1/2009 |
| WO | WO02/15277 A2 | 2/2002 |

(Continued)

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Robert Huber
*Assistant Examiner* — J. R. Oakley
(74) *Attorney, Agent, or Firm* — The Marbury Law Group PLLC

(57) ABSTRACT

A method of making a monolithic three dimensional NAND device includes forming a stack of alternating layers of a first material and a second material different from the first material over a substrate, forming a mask layer over the stack and patterning the mask layer to form at least on opening in the mask layer to expose a top layer of the stack. The method also includes forming a metal block in the at least one opening in the mask layer, etching the stack by metal induced localized etch using the metal block in the at least one opening in the mask layer to form at least one opening in the stack and forming at least one layer of the NAND device in the at least one opening.

19 Claims, 11 Drawing Sheets

(56) References Cited

U.S. PATENT DOCUMENTS

| | | |
|---|---|---|
| 5,985,753 A | 11/1999 | Yu et al. |
| 6,953,697 B1 | 10/2005 | Castle et al. |
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,349,681 B2 | 1/2013 | Alsmeier et al. |
| 8,394,716 B2 | 3/2013 | Hwang et al. |
| 8,445,347 B2 | 5/2013 | Alsmeier |
| 8,450,181 B2 | 5/2013 | Chen et al. |
| 8,614,126 B1 | 12/2013 | Lee et al. |
| 8,658,499 B2 | 2/2014 | Makala et al. |
| 8,828,884 B2 | 9/2014 | Lee et al. |
| 8,847,302 B2 | 9/2014 | Alsmeier et al. |
| 8,884,357 B2 | 11/2014 | Wang et al. |
| 2002/0168849 A1 | 11/2002 | Lee et al. |
| 2006/0068592 A1 | 3/2006 | Dostalik |
| 2007/0210338 A1 | 9/2007 | Orlowski |
| 2007/0252201 A1 | 11/2007 | Kito et al. |
| 2008/0258308 A1 | 10/2008 | Liu et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0148237 A1 | 6/2010 | Kito et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0266606 A1 | 11/2011 | Park et al. |
| 2011/0291177 A1 | 12/2011 | Lee et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0001252 A1* | 1/2012 | Alsmeier .......... H01L 27/11551 257/321 |
| 2012/0034785 A1 | 2/2012 | Hayashi et al. |
| 2012/0146127 A1 | 6/2012 | Lee et al. |
| 2012/0256247 A1 | 10/2012 | Alsmeier |
| 2013/0069139 A1 | 3/2013 | Ishihara et al. |
| 2013/0069140 A1 | 3/2013 | Ichinose et al. |
| 2013/0107628 A1 | 5/2013 | Dong et al. |
| 2013/0243956 A1 | 9/2013 | Ma |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2014/0054670 A1 | 2/2014 | Lee et al. |
| 2014/0225181 A1 | 8/2014 | Makala et al. |
| 2014/0264525 A1 | 9/2014 | Takahashi et al. |
| 2014/0273373 A1 | 9/2014 | Makala et al. |
| 2014/0295636 A1 | 10/2014 | Makala et al. |
| 2016/0020295 A1* | 1/2016 | Chen .................... H01L 29/456 257/49 |

FOREIGN PATENT DOCUMENTS

| | | |
|---|---|---|
| WO | WO2009/085078 A1 | 7/2009 |
| WO | WO2012/003301 A2 | 1/2012 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M. et al., "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

Ooshita, J., Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Li et al., "Sacrificial Polymers for Nanofluidic Channels in Biological Applications", Nanotechnology 14 (2003) 578-583.

Bachmann et al., "A Simple Method for Deposition of $SiO_2$ by ALD," Max Planck Institute of Microstructure Physics, Annual Reports, 2008, pp. 46-47.

Hiller et al., "Low Temperature Silicon Dioxide by Thermal Atomic Layer Deposition: Investigation of Material Properties," Journal of Applied Physics, 107, 064314 (2010).

International Search Report and Written Opinion received in connection with international application No. PCT/US2014/044833; mailed Oct. 2, 2014.

Invitation to Pay Additional Search Fees, International Application No. PCT/US13/24638, issued Apr. 24, 2013.

International Search Report and Written Opinion received in connection with international application No. PCT/US2013/049758, mailed Jan. 21, 2014 (1 pg.).

Qian et al., "Fabrication of Si Microstructures Using Focused Ion Beam Implantation and Reactive Ion Etching," 2008 J. Micromech. Microeng. 18, 035003, 5pgs.

Sievila et al., "The Fabrication of Silicon Nanostructures by Focused-Ion-Beam Implantation and TMAH Wet Etching," 2010 Nanotechnology, 21, 145301, 6pgs.

Chekurov et al., "The Fabrication of Silicon Nanostructures by Local Gallium Implantation and Cryogenic Deep Reactive Ion Etching," 2009 Nanotechnology, 20, 065307, 5pgs.

Geil et al., "Etch Resistance of Focused-Ion-Beam-Implanted $SiO_2$," LEOS 1991: Summer Topical Meetings on Epitaxial Materials and In-situ Processing for Optoelectronic Devices, Jul. 29-31, 1991 and Microfabrication for Photonics an Optoelectronics, Jul. 31-Aug. 2, 1991.

U.S. Appl. No. 13/933,236, filed Jul. 2, 2013, SanDisk Technologies, Inc.

U.S. Appl. No. 14/133,979, filed Dec. 19, 2013, SanDisk Technologies, Inc.

Endoh, et al., "Novel Ultra High Density Memory with a Stacked-Surrounding Gate Transistor (S-SGT) Structured Cell," IEDM Proc. (2001) 33-36.

* cited by examiner

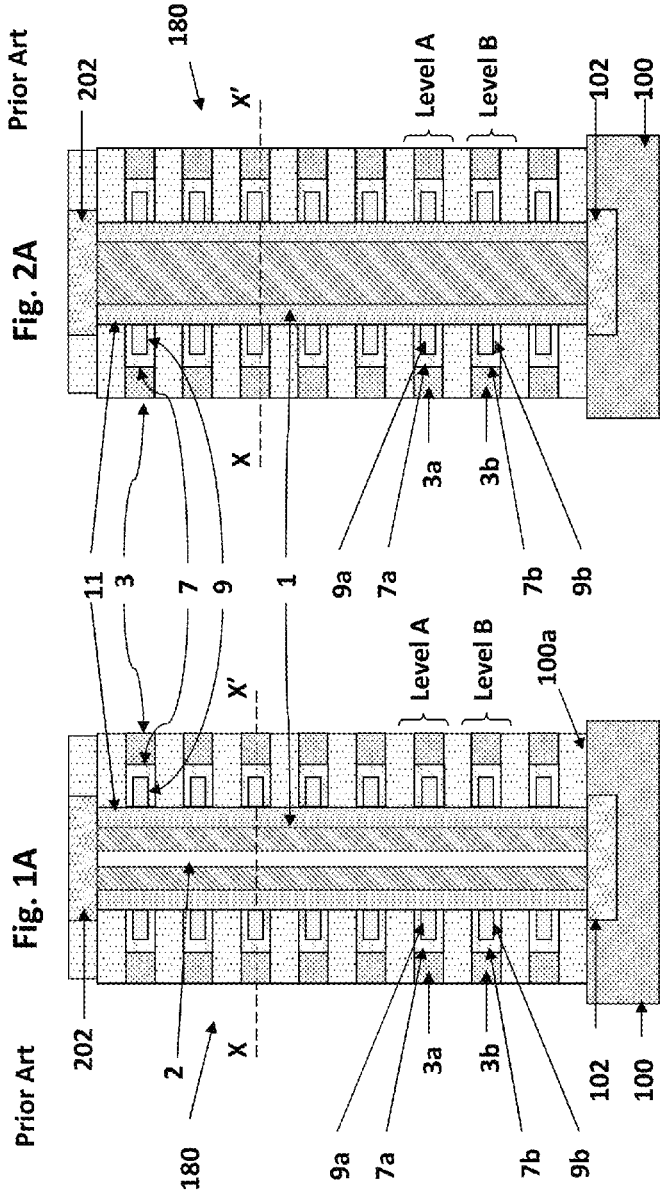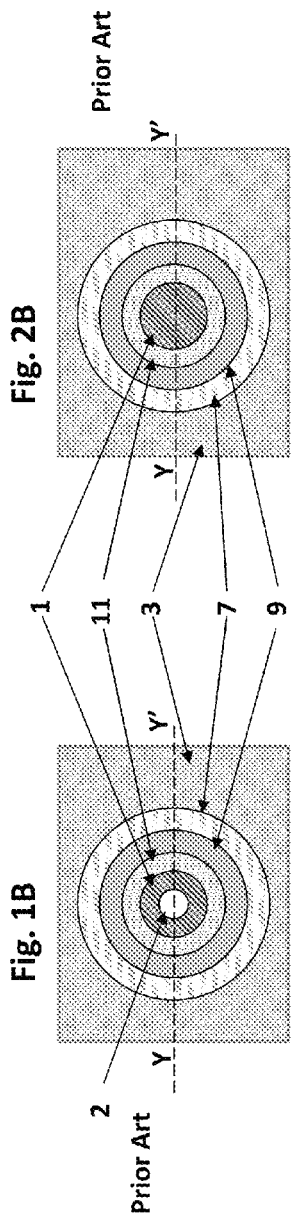

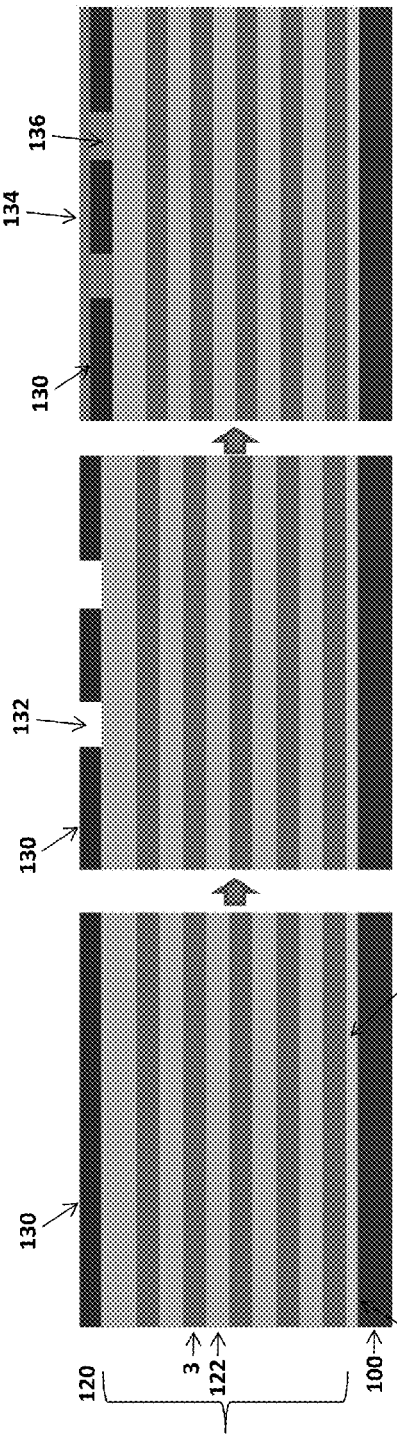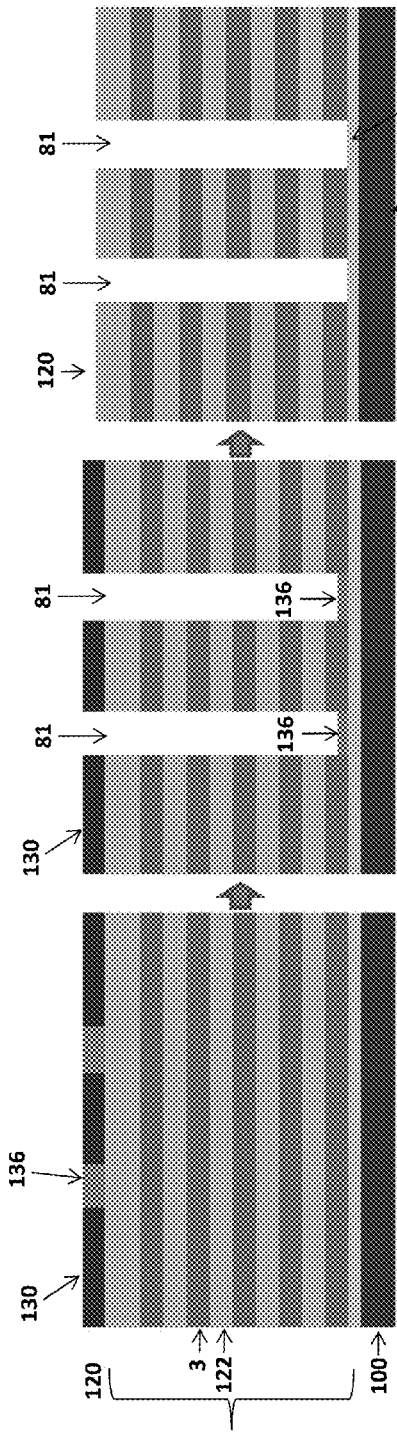

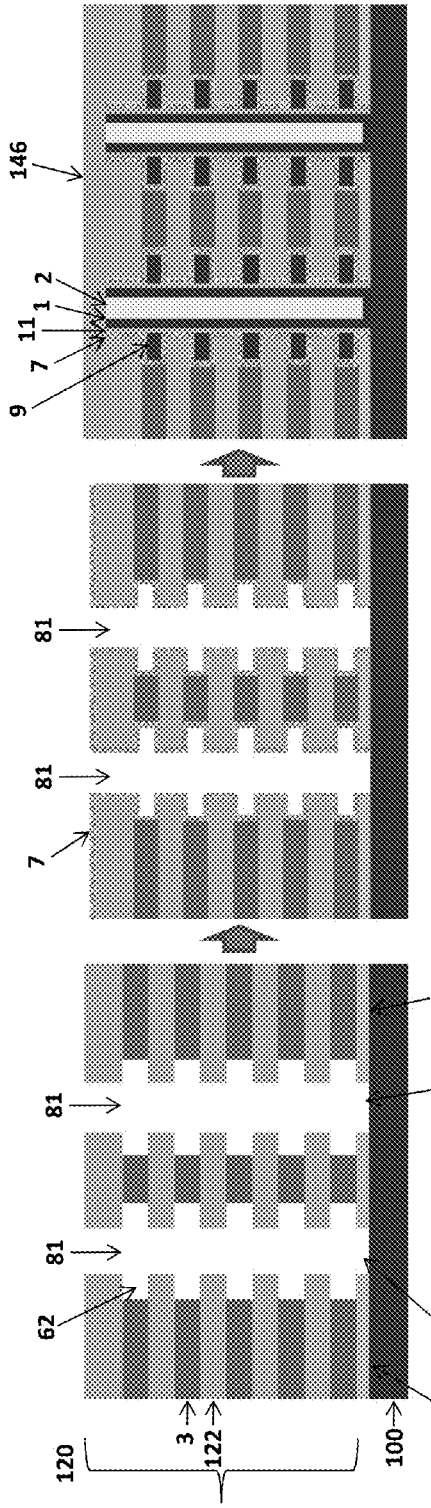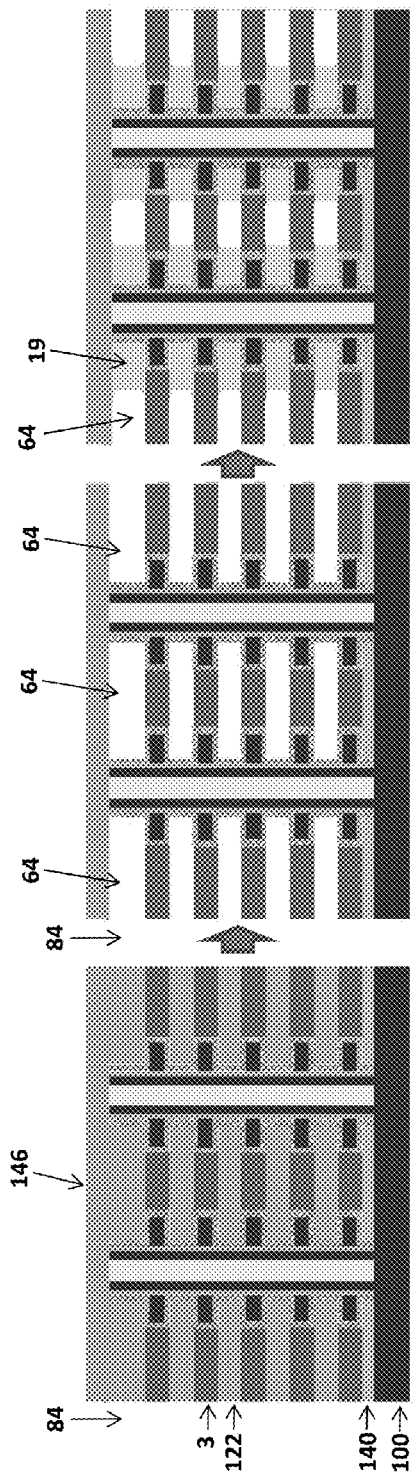

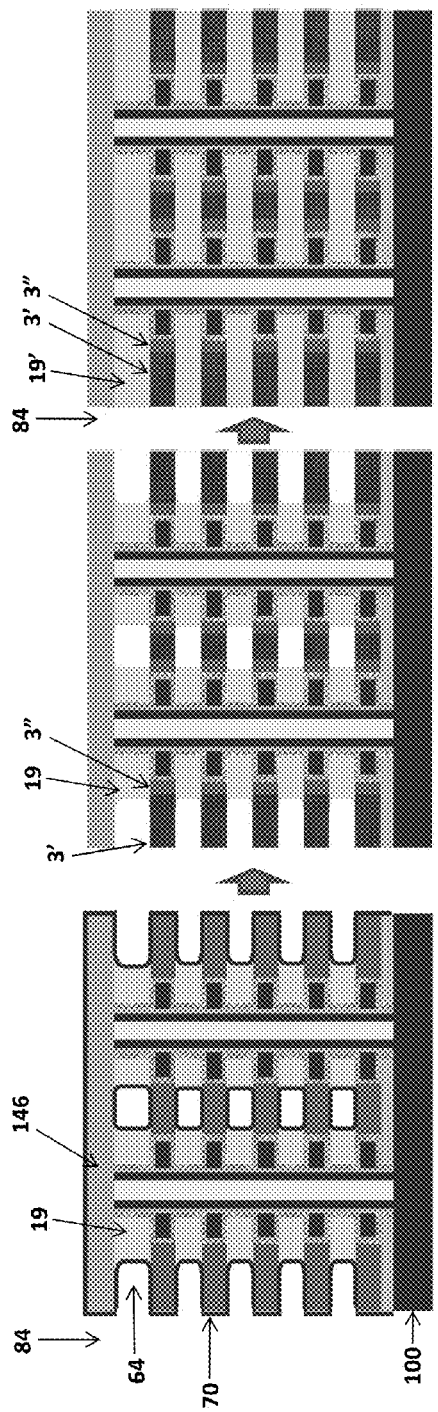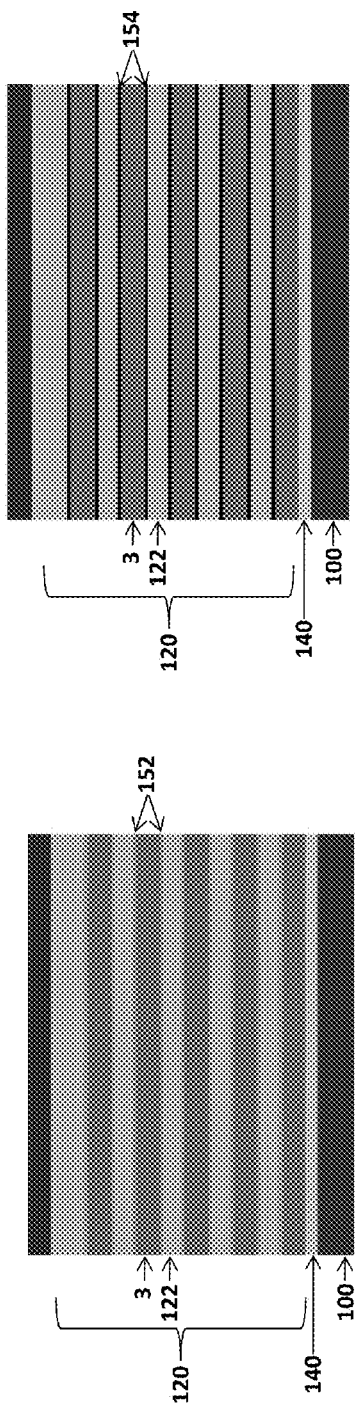

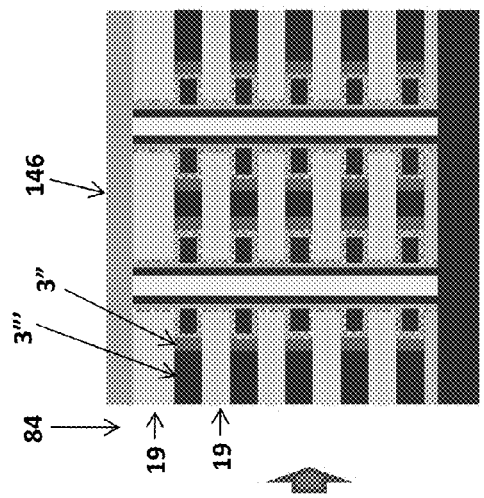
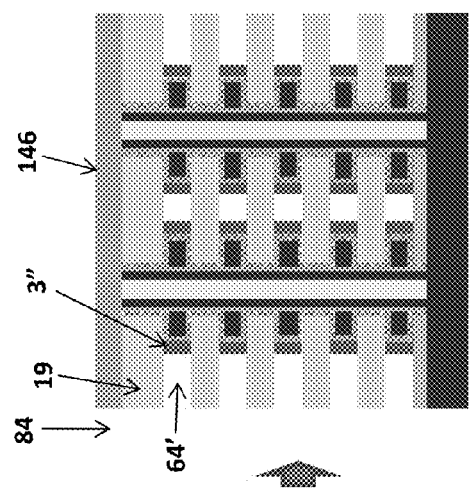
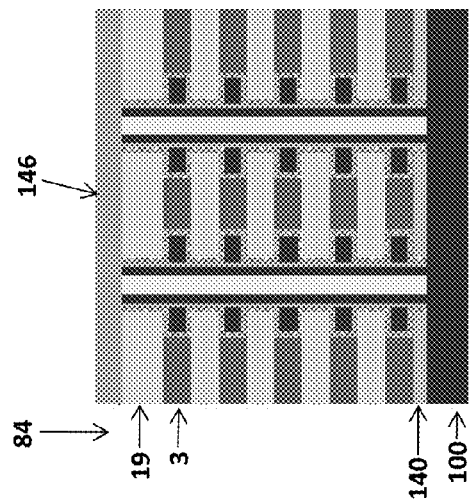

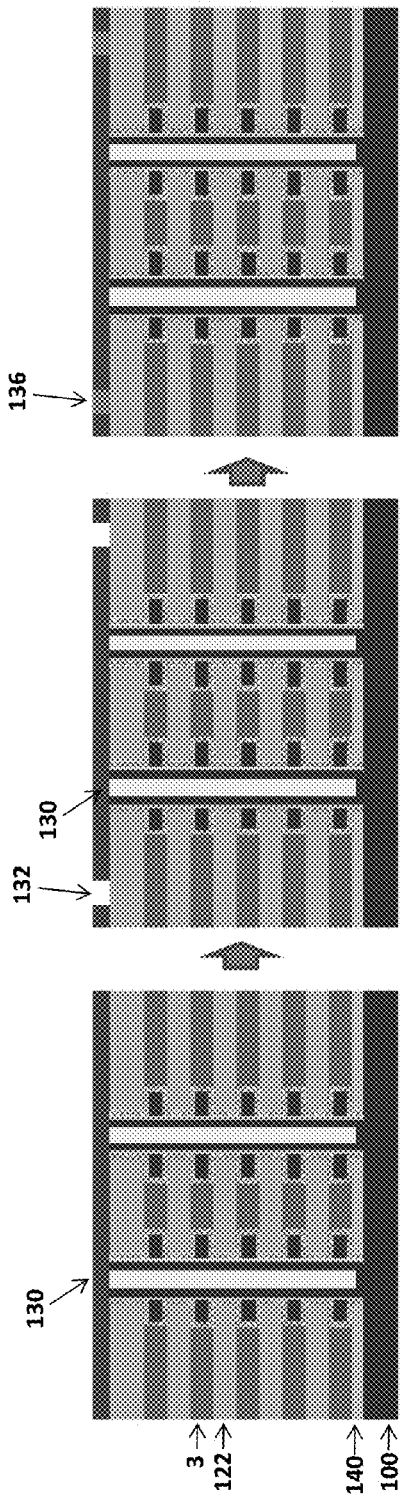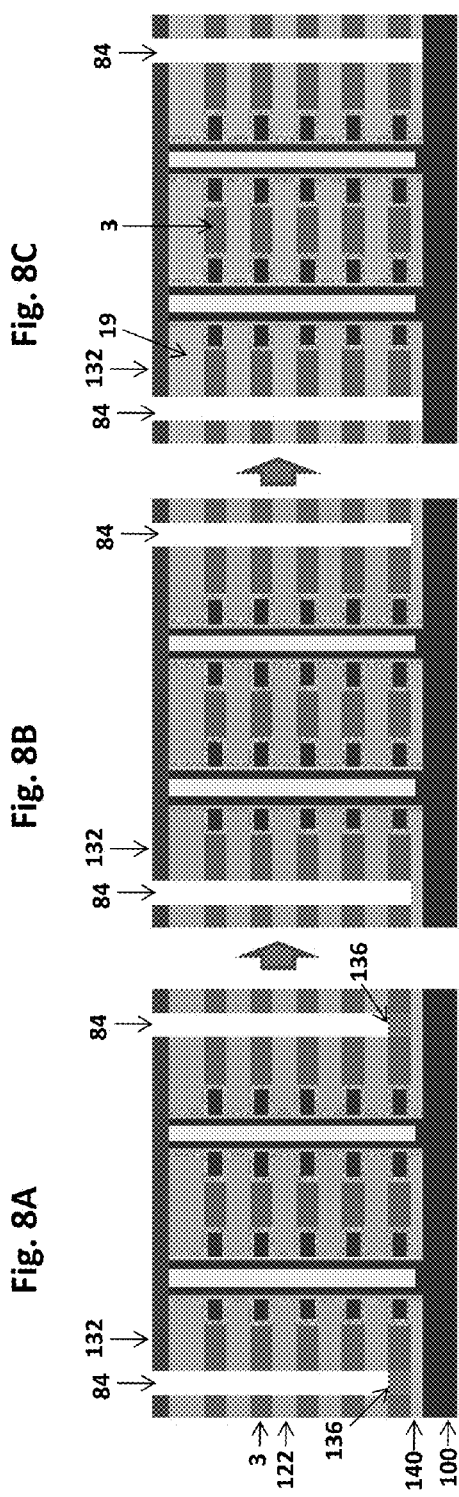

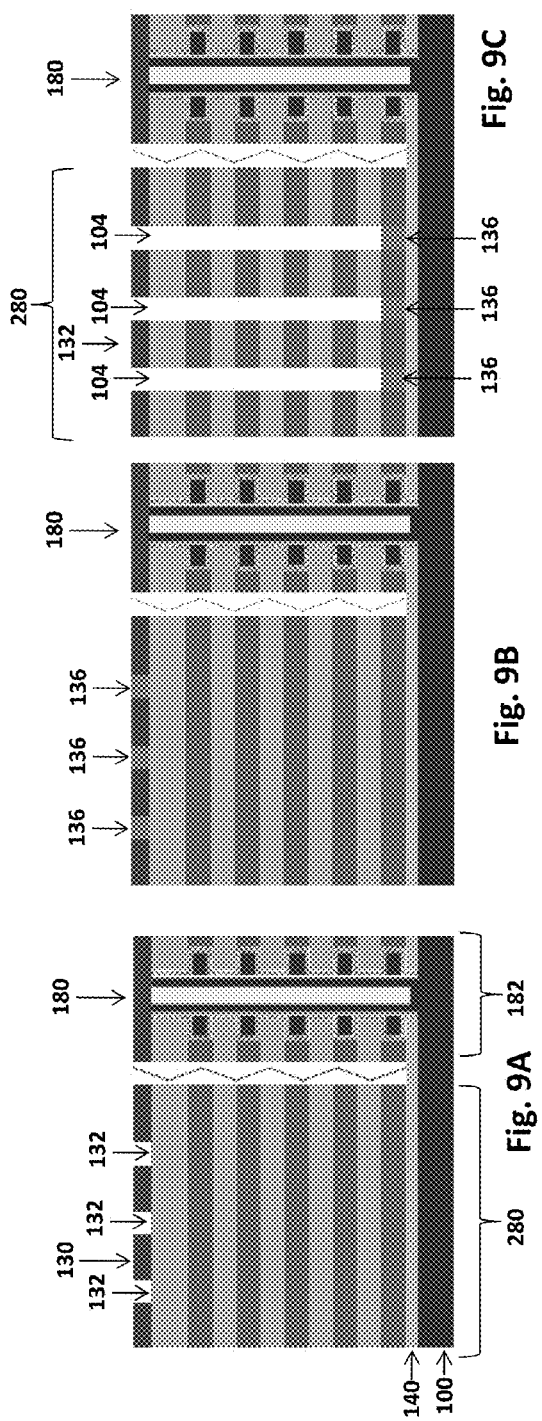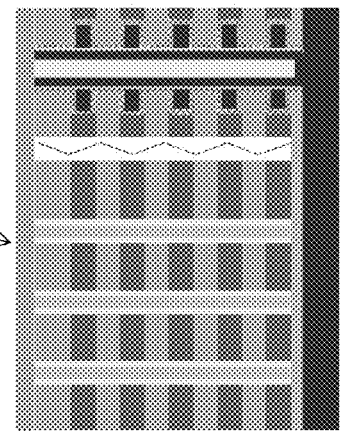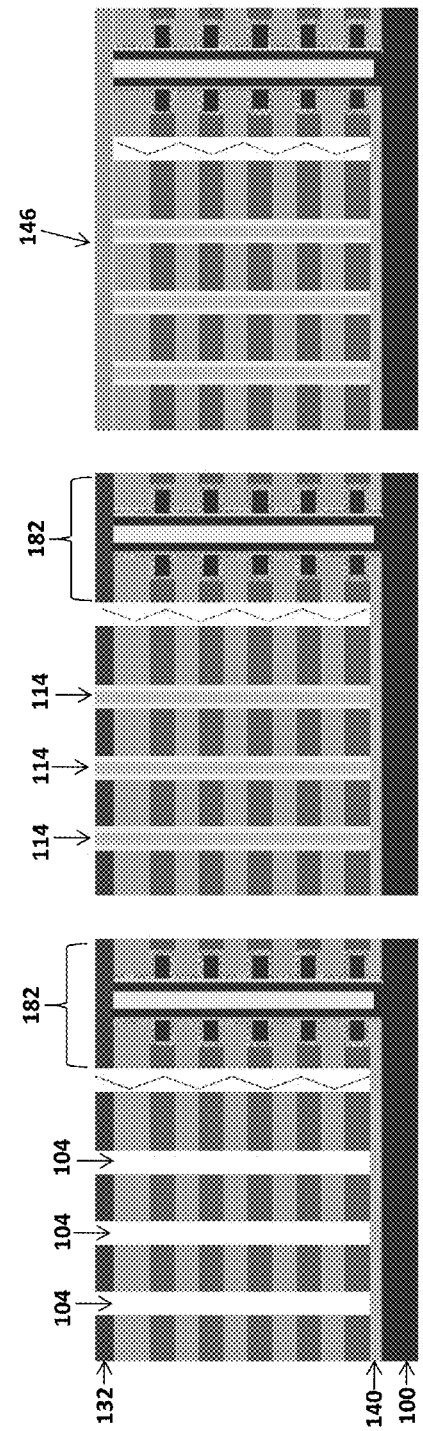

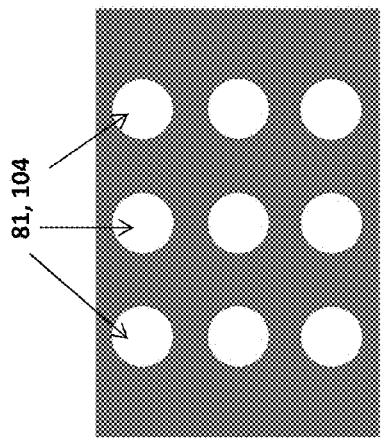
Fig. 10A
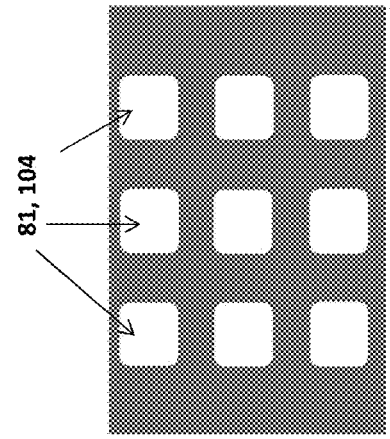
Fig. 10B
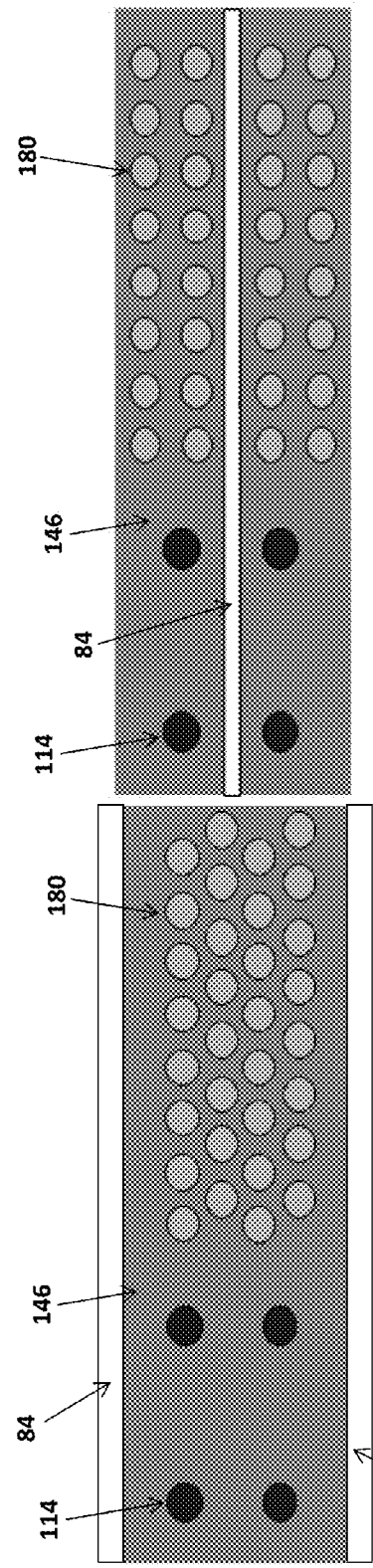
Fig. 11A
Fig. 11B

HIGH STACK 3D MEMORY AND METHOD OF MAKING

FIELD

The present disclosure relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

An embodiment relates to a method of making a monolithic three dimensional NAND device including forming a stack of alternating layers of a first material and a second material different from the first material over a substrate, forming a mask layer over the stack and patterning the mask layer to form at least on opening in the mask layer to expose a top layer of the stack. The method also includes forming a metal block in the at least one opening in the mask layer, etching the stack by metal induced localized etch using the metal block in the at least one opening in the mask layer to form at least one opening in the stack and forming at least one layer of the NAND device in the at least one opening.

Another embodiment relates to a method of making a monolithic three dimensional NAND device including forming a stack of alternating layers of a first polysilicon material and a second material different from the first polysilicon material over a substrate, forming the at least one front side opening in the stack and forming at least a portion of a memory film and a semiconductor channel in the front side opening. The method also includes forming a back side trench through the stack, selectively removing the second material layers through the back side trench to form first back side recesses between adjacent first polysilicon material layers and to expose the first polysilicon material layers in the back side recesses, at least partially filling the first back side recesses with an insulating material to form interlayer insulating layers in the respective first back side recesses; and forming control gate electrodes between the interlayer insulating layers, each control gate electrode comprising a front polysilicon portion and a back metal, metal silicide or metal nitride portion which is located farther from the semiconductor channel than the front portion.

Another embodiment relates to a monolithic three dimensional NAND string including a semiconductor channel, at least one end portion of the semiconductor channel extending substantially perpendicular to a major surface of a substrate and a plurality of control gate electrodes having major surfaces extending substantially parallel to the major surface of the substrate. The plurality of control gate electrodes comprise at least a first control gate electrode located in a first device level and a second control gate electrode located in a second device level located over the major surface of the substrate and below the first device level. The first control gate electrode is separated from the second control gate electrode by an interlayer insulating layer located between the major surfaces of the first and second control gate electrodes. The NAND string also includes a blocking dielectric located in contact with the plurality of control gate electrodes, a plurality of charge storage regions comprising at least a first charge storage region located in the first device level and a second charge storage region located in the second device level and a tunnel dielectric layer located between the plurality of the charge storage regions and the semiconductor channel. The NAND string contains more than 60 device levels and wherein the semiconductor channel has substantially vertical sidewalls and a substantially uniform cross section when viewed from the top.

Another embodiment relates to a monolithic three dimensional NAND string including a semiconductor channel, at least one end portion of the semiconductor channel extending substantially perpendicular to a major surface of a substrate and a plurality of control gate electrodes having major surfaces extending substantially parallel to the major surface of the substrate. The plurality of control gate electrodes comprise at least a first control gate electrode located in a first device level and a second control gate electrode located in a second device level located over the major surface of the substrate and below the first device level. The first control gate electrode is separated from the second control gate electrode by an interlayer insulating layer located between the major surfaces of the first and second control gate electrodes. The NAND string also includes a blocking dielectric located in contact with the plurality of control gate electrodes, a plurality of charge storage regions comprising at least a first charge storage region located in the first device level and a second charge storage region located in the second device level and a tunnel dielectric layer located between the plurality of the charge storage regions and the semiconductor channel. Each control gate electrode comprises a front polysilicon portion and a back metal, metal silicide or metal nitride portion which is located farther from the semiconductor channel than the front portion.

BRIEF DESCRIPTION OF THE DRAWINGS

FIGS. 1A and 1B are respectively side cross sectional and top cross sectional views of a NAND string according to one embodiment. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of a NAND string according to another embodiment. FIG. 2A is a side cross sectional view of the device along line Y-Y' in FIG. 2B, while FIG. 2B is a side cross sectional view of the device along line X-X' in FIG. 2A.

FIGS. 4A-4F are side cross sectional views of illustrating a method of making memory holes for a NAND string device according to an embodiment.

FIGS. 5A-5I are side cross sectional views of illustrating a method of making a NAND string device according to an embodiment.

FIGS. 6A and 6B are side cross sectional views of illustrating embodiments of dopant diffusion bathers for NAND strings.

FIGS. 7A to 7C are side cross sectional views of illustrating a method of making a NAND string device according to another embodiment.

FIGS. 8A-8F are side cross sectional views of illustrating a method of making back side slit trenches for a NAND string according to an embodiment.

FIGS. 9A-9F are side cross sectional views of illustrating a method of making support pillars for a NAND string device according to an embodiment.

FIGS. 10A and 10B are plan views illustrating embodiments of memory hole shapes.

FIGS. 11A and 11B are plan views illustrating embodiments of NAND string memory devices.

DETAILED DESCRIPTION

Figure 3A:
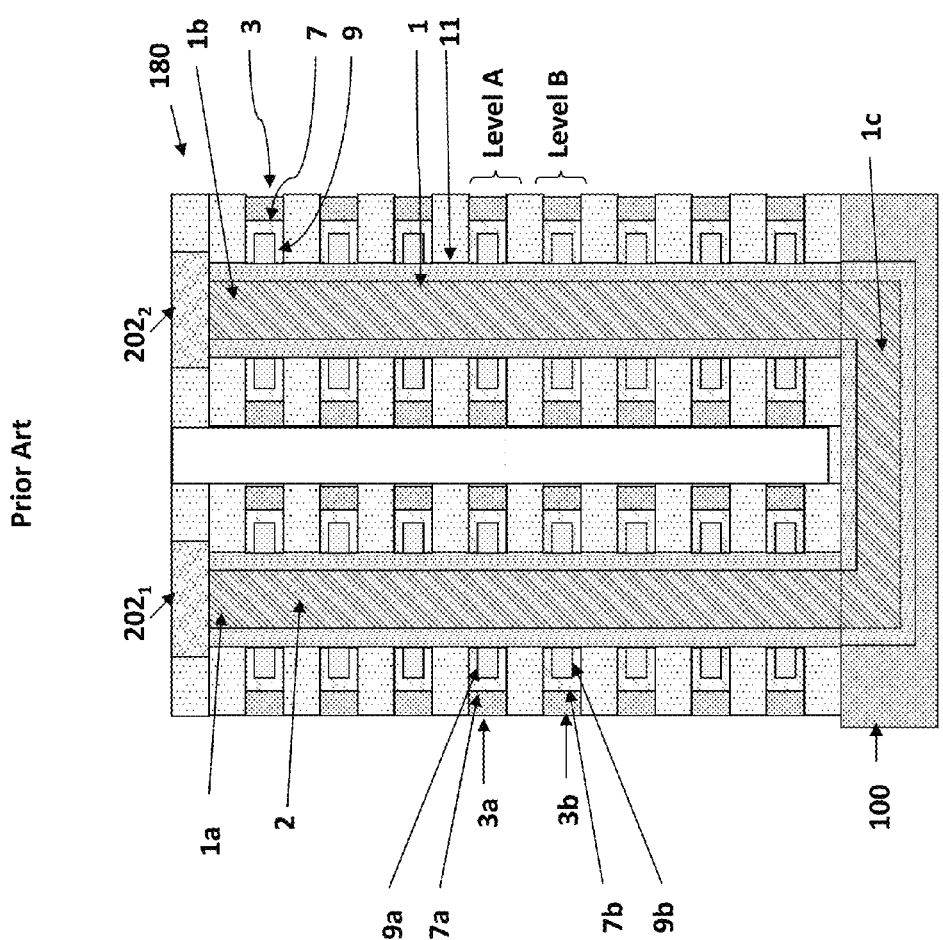
FIG. 3A is a side cross sectional view of a NAND string of another embodiment with a U-shaped channel.

The present inventors have realized that increasing the height of the stack of a NAND string device increases tensile stress in the stack. This increase in tensile stress may result in warping of the substrate wafer. In one conventional process, fabrications starts with a stack of alternating layers of silicon oxide and silicon nitride (ONON stack). The nitride layer is removed and replaced with tungsten to make the word lines (e.g. control gates) of the device. However, the use of tungsten for the word lines exacerbates the tensile stress/warping problem. This is because tungsten has a high bulk modulus which generates higher tensile stress than low bulk modulus materials.

An additional issue with the fabrication of high stack (e.g. stacks with more than 60 layers) NAND devices is that the vertical scalability of the NAND stack and the size of the memory hole (also referred to as a front side opening or memory opening) depends on the memory hole etch aspect ratio. The conventional stack height to memory hole diameter is high, which limits the scaling of the thickness of oxide and nitride layers.

Additionally, achieving a straight and/or vertical hole profile with conventional dry etching processes beyond a stack height of 60 levels is difficult. This is true for memory holes, slit trenches and support pillar holes. For example, the hole diameter/width tends to vary from top to bottom in the stack. Additionally, the circumference/perimeter of the holes may become irregularly shaped as etching progresses. This irregularity is believed to be caused by induced non-volatile plasma polymer deposition on the sidewalls of the holes.

For devices that use a vertical dielectric charge trap layer and channel located in the memory hole, the amount of charge trapped impacts the program, erase and read verify voltage levels. Further, the electric field is higher at sharp edges versus smoother surfaces. Thus, a variation or irregularity in the hole shape may lead to variations in the data retention and read verify levels within a memory hole as well as variations from memory hole to memory hole.

Further, etching of higher stacks requires a thicker hard mask layer to protect the unexposed stack during etching. However, use of a thicker hard mask may lead to clogging, bowing and to a non-uniform etch profile in the hard mask itself. Further it is more difficult to open a thick hard mask for a high aspect ratio etch than for a low aspect ratio etch.

However, the inventors have discovered that a metal induced localized etching process ("MILE") may be used to etch high aspect ratio holes with substantially uniform width and substantially vertical sidewalls in high stacks. That is, such ratio holes may be etched in stacks with 60 or more layers. In an embodiment, a block (e.g. plug) of metal of a desired shape is placed in contact with the top layer of the stack. The stack is then exposed to a wet etch, such as an aqueous solution of hydrogen peroxide ($H_2O_2$) and hydrofluoric acid (HF). The metal block catalyzes the dissolution of portion of the stack in contact with the metal block. That is, the portion of each layer of the stack underneath the block is sequentially dissolved without consumption of the metal block as the block passes through the stack.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3B:
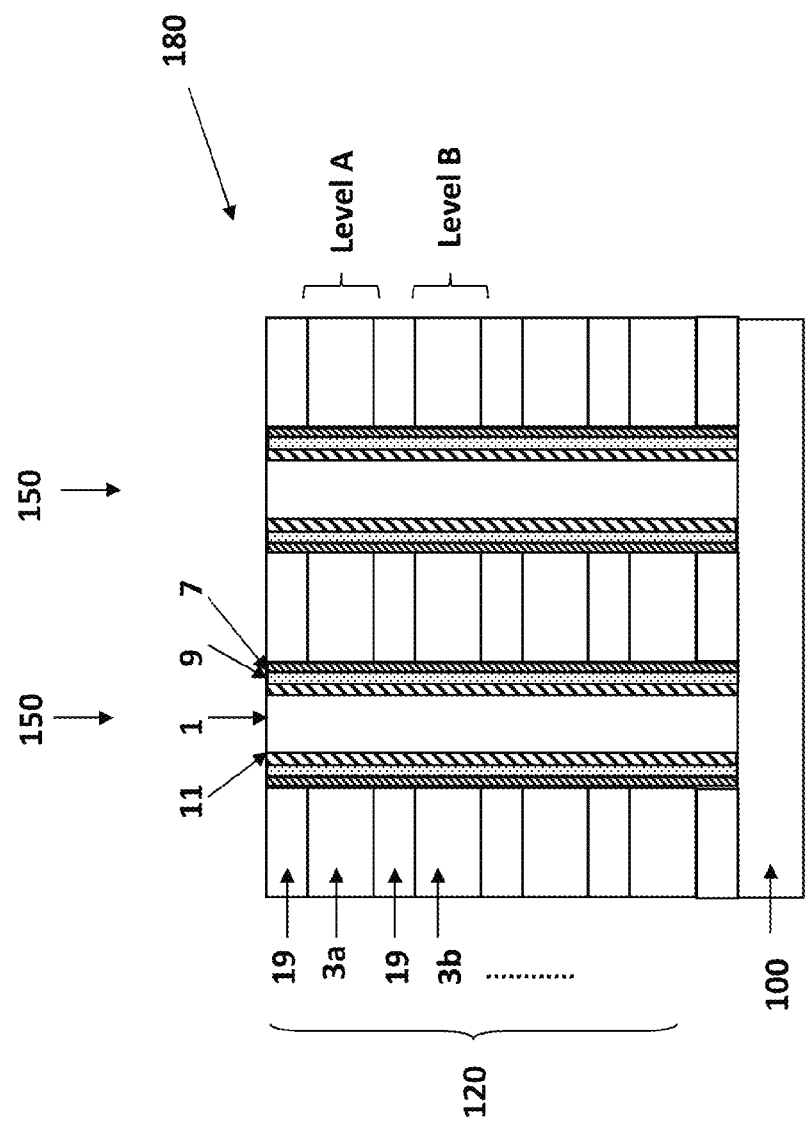
FIG. 3B is a side cross sectional view of another embodiment NAND string.

In some embodiments, the monolithic three dimensional NAND string 180 comprises a semiconductor channel 1 having at least one end portion extending substantially perpendicular to a major surface 100a of a substrate 100, as shown in FIGS. 1A, 2A and 3B. "Substantially perpendicular to" (or "substantially parallel to") means within 0-10°. For example, the semiconductor channel 1 may have a pillar shape and the entire pillar-shaped semiconductor channel extends substantially perpendicularly to the major surface of the substrate 100, as shown in FIGS. 1A, 2A and 3B. In these embodiments, the source/drain electrodes of the device can include a lower electrode 102 provided below the semiconductor channel 1 and an upper electrode 202 formed over the semiconductor channel 1, as shown in FIGS. 1A and 2A.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-3B for clarity.

In some embodiments, the semiconductor channel 1 may be a filled feature, as shown in FIGS. 2A, 2B, 3A and 3B. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3A and/or the channel 1 shown in FIG. 3B may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3A and 3B. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof. For example, the control gate material in FIGS. 1A, 2A and 3A may comprise a conductive metal or metal alloy, such as tungsten and/or titanium nitride, while the control gate material in FIG. 3B may comprise doped polysilicon.

A blocking dielectric 7 is located adjacent to the control gate(s) 3 and may surround the control gate electrodes 3, as shown in FIGS. 1A, 2A and 3A. Alternatively, a straight blocking dielectric layer 7 may be located only adjacent to an edge (i.e., minor surface) of each control gate electrode 3, as shown in FIG. 3B. The blocking dielectric 7 may comprise a layer having plurality of blocking dielectric segments located in contact with a respective one of the plurality of control gate electrodes 3, for example a first blocking dielectric segment 7a located in device level A and a second blocking dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three dimensional NAND string also comprise a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions 9, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers).

FIGS. 4A-4F are side cross sectional views of illustrating a method of making memory holes for a NAND string according to an embodiment.

Referring to FIG. 4A, a stack 120 of alternating first material layers 3 and second material layers 122 are formed over the major surface 100a of the substrate 100. Layers 3 and 122 may be deposited over the substrate by any suitable deposition method, such as sputtering, CVD, PECVD, MBE, etc. In an embodiment, the first material layers 3 comprise a control gate material, such as doped polysilicon. The second material layers 122 comprise a sacrificial material, such as intrinsic polysilicon. In an embodiment, an etch stop layer 140 is deposited on the substrate 100 prior to forming the stack 120. The etch stop layer 140 may be made of any suitable material, such as silicon oxide or silicon nitride.

After forming the stack 120, a sacrificial layer 130 is formed over the stack 120. The sacrificial layer 130 may be made of any suitable material that may be used as an etch mask, such as a hard mask material, for example silicon nitride.

Next, as illustrated in FIG. 4B, the sacrificial layer 130 is patterned to form at least one opening 132 in the sacrificial layer 130 to expose a top layer of the stack 120. The sacrificial layer 130 may be patterned by any suitable method, such as reactive ion etching.

Then, as illustrated in FIG. 4C, a metal layer 134 is deposited over the sacrificial layer 130 and in the openings 132 in the sacrificial layer 130. Suitable metals for the layer 134 include metals that catalyze etching of the first and second materials layers 3, 122. If the first material layers 3 are doped polysilicon and the second material layers 122 are intrinsic polysilicon, then suitable metals for the sacrificial layer 130 include, but are not limited to, silver, gold, platinum, palladium and copper.

Next, as illustrated in FIG. 4D, the metal layer 134 is removed from the surface of the sacrificial layer 130, leaving the metal blocks (e.g. plugs) 136 in the openings 132 in the sacrificial layer 130. The metal layer 134 may be removed via an etch back process or via a chemical-mechanical polishing (CMP) process.

Then, as illustrated in FIG. 4E, openings are formed in the stack 120 via a catalytic metal induced localized etching ("MILE") process (which is also known as metal assisted chemical etching, "MACEtch"). As illustrated in FIG. 4E, the openings are front side (memory hole) openings 81. As discussed in more detail below, the metal induced catalytic etching process may also be used to form back side openings (slit trenches) 84 (FIGS. 8A-8F) and support pillar holes 104 (FIGS. 9A-9F).

In an embodiment, the stack 120 is exposed to a wet etch solution comprising an aqueous solution of hydrogen peroxide ($H_2O_2$) and hydrofluoric acid (HF). The metal blocks 136 catalyze the etching process. Specifically, the metal blocks 136 serve as local cathodes that catalyze the reduction of oxidants (e.g. $H_2O_2$), which produces holes ($h^+$). When the underlying first and second layers 3, 122 in the stack 120 are semiconducting materials, the holes ($h^+$) are injected into the valence bands of the semiconductor first and second layers 3, 122. The holes oxidize the semiconductor first and second layers 3, 122, generating the formation of silicon dioxide which is soluble in an acidic solution (e.g. HF). Thus, in an embodiment, the step of etching the stack 120 comprises providing a solution comprising hydrogen peroxide and hydrofluoric acid to the metal block 136 in the at least one opening 132 in the mask layer. The hydrogen peroxide oxidizes a surface of the doped or intrinsic polysilicon first or second material layer 3, 122 below the metal block 136 to form a silicon oxide region below the metal block. The hydrofluoric acid etches the silicon oxide region causing the metal block 136 to sink into the stack 120. The silicon oxide region formation, silicon oxide region etching and metal block 136 sinking into the stack 120 are repeated a plurality of times to form the opening 81, 84 or 104.

The overall result is the removal of semiconductor material without a net consumption of the metal blocks 136. The overall reaction for the oxidation and removal of silicon in a solution of $H_2O_2$ and HF catalyzed by metal can be written as $Si+H_2O_2+6HF=2H_2O+H_2SiF_6+H_2$. In this reaction, the half cell reaction at the cathode (metal blocks 136) is $Si+4h^+=Si^{4+}$, while the half cell reaction at the anode (silicon substrate) is $2H^++2e^-=H_2$. The metal block 136 sinks through the stack 120 as each successive first and second layers 3, 122 are dissolved. The resulting front side opening 81 has substantially vertical sidewalls and a substantially uniform cross section when viewed from the top.

Next, as illustrated in FIG. 4F, the sacrificial layer 130 is removed from the top of the stack 120. Additionally, the metal blocks 136 are removed from the bottom of the front side openings 81 by metal selective etching. As illustrated in FIG. 4F, the etch stop layer 140 protects the underlying substrate 100 from both the catalytic etching of the stack 120 and during removal of the metal blocks 136.

FIGS. 5A-5I are side cross sectional views of illustrating a method of making a NAND string using the etched stack 120 according to an embodiment.

This method starts with the etched stack 120 illustrated in FIG. 4F, i.e. a stack 120 with front side openings 81. As illustrated in FIG. 5A, the first material layers 3 are recessed to form front side recesses 62 between adjacent second material layers 122. The recesses 62 may be formed by any the method which selectively etches the first material layers 3 compared to the second material layers 122. Selective etch methods that may be used include selective, isotropic wet etching and selective dry etching.

Next, as illustrated in FIG. 5B, at least a portion of a memory film is formed in the front side opening 81. First, a blocking dielectric 7 is formed in the front side recesses 62 through the front side opening 81 such that the blocking dielectric 7 coats the sides of the front side recesses 62 and the front side of the second material layers 122 exposed in the front side opening 81. The blocking dielectric 7 forms a plurality of clam shaped regions in the front side recesses 62. The blocking dielectric layer 7 may comprise a silicon oxide layer deposited by conformal atomic layer deposition (ALD) or chemical vapor deposition (CVD). Alternatively, high-k dielectric materials, such as hafnium oxide or other metal oxide materials, such as $Al_2O_3$ or $Ta_2O_5$, or multi-layer dielectrics (e.g., NONON, NOHON, NAON) or high-k stacks such as HAH, HOH (where $A=Al_2O_3$; $H=HfO_2$, $HfSiO_2$ or HfSiO; $N=Si_3N_4$ and $O=SiO_2$) may be used instead of or in addition to silicon oxide.

Then, as illustrated in FIG. 5C, charge storage regions 9 are formed over the blocking dielectric 7 in the front side recesses 62. For example a floating gate material, such as polysilicon, is formed in the opening of the clam shaped regions of the blocking dielectric 7 in the front side recesses 62 to form discrete floating gate regions 9. In an embodiment, any excess floating gate material is the front side opening 81 is removed by directional dry etching. Then, a tunnel dielectric 11 is formed in the front side opening 81 over the blocking dielectric 7 and the exposed portion of the discrete floating gate regions 9 in the clam shaped regions of the blocking dielectric 7.

After forming the tunnel dielectric 11, a semiconductor channel 1 is formed over the tunnel dielectric in the front side opening 81. In an embodiment, the semiconductor channel 1 fills an remaining space in the front side opening 81. In an alternative embodiment, the semiconductor channel 1 forms a hollow cylinder in the front side opening 81. Optionally, an insulating fill material 2 may be deposited in the hollow portion of the semiconductor channel as illustrated in FIG. 5C. After filling the front side opening 81, the top surface of the stack 120 may be planarized, such as with an etch back or CMP process to remove unwanted material on the top surface of the stack 120, such as unwanted blocking or tunnel dielectric, channel material or fill material. A cover layer 146 may then be deposited over the stack 120. The cover layer 146 may be of any suitable material, such as silicon oxide formed by CVD using a TEOS source.

Next, as illustrated in FIG. 5D, a back side opening 84 is formed in the cover layer 146 and the stack 120. The back side opening 84 may be formed by a second MILE step. In an embodiment, the back side opening 84 is in the shape of a slit trench through which portions of several NAND strings may be formed at the same time.

Then, as illustrated in FIG. 5E, the second material layers 122 are selectively removed via the back side opening 84 to form back side recesses 64 between adjacent first material layers 3. Thus, if the first material layers 3 comprise doped polysilicon and the second material layers 122 comprise intrinsic polysilicon, any etchant may be used that selectively etches intrinsic polysilicon over doped polysilicon.

Next, as illustrated in FIG. 5F, the back side recesses 64 may be at least partially (e.g. fully or partially) filled with an insulating material 19, such as silicon oxide. In an embodiment, a recess etch is performed after partially filling the back side recesses 64 to fine-tune the amount of the back side recesses 64 filled with the insulating material 19.

Then, as illustrated in FIG. 5G, one or more layers of control gate conductor layer 70 is formed in back side recesses 64 and over the sidewalls of the back side openings

84. The layer 70 may be any metal or metal alloy, for example a metal that is capable of forming a silicide. Suitable metals include, but are not limited to, Ti, Ni, W and Co. Optionally, a metal nitride barrier, such as, TiN, WN, or TaN may be deposited under layer 70.

Optionally, as illustrated in FIG. 5H, the device is heated to a temperature sufficient to cause the layer of metal 70 to react with the doped polysilicon first material layer 3 to form a metal silicide control gate layer 3'. In an embodiment, heating is performed by rapid thermal annealing. In the embodiment illustrated in FIG. 5H, a portion of the polysilicon first material layer 3 is protected by the insulating layer 19 in the back side recesses 64. In this embodiment, the control gate includes a first portion comprising a metal silicide control gate 3' and a second portion 3" comprising the first material layer 3. In an embodiment, the control gate electrode includes a metal silicide (e.g. $WSi_x$, $CoSi_x$, $TiSi_x$, $NiSi_x$, etc.) first portion 3' and a polysilicon second portion 3".

Thus, in this embodiment, forming the control gate electrodes 3 between the interlayer insulating layers 19 includes forming a metal layer 70 in the back side trench 84 and in the back side recesses 84 in contact with sidewalls of the first material layers 3 exposed in the back side trench 84 and in the back side recesses 64 in contact with back portions of horizontal surfaces of the first material layers 3 exposed in the back side recesses 64. The method also includes reacting the metal layer 70 with the first material layers (e.g., polysilicon layers) 3 to transform back portions of the first material layers 3 into a metal silicide 3', while front portions 3" of the first material layers 3 located between the interlayer insulating layers 19 remain as doped silicon (e.g., polysilicon) layers to form control gate electrodes having silicide back portions 3' and doped silicon front portions 3". The remaining portions of the back side recesses 64 are then filled with an insulating material 19' through the trench 84.

Next, as illustrated in FIG. 5I, the remaining unfilled portion of the back side recesses 64 are filled with an insulating material 19', such as $SiO_2$. In an embodiment, the remaining unfilled portion of the back side recesses 64 is filled with the same insulating material 19 used to partially fill the back side recesses 64 in the step illustrated in FIG. 5F.

FIGS. 6A and 6B are side cross sectional views of illustrating embodiments of dopant diffusion barriers suitable for NAND strings, as discussed in more detail below. Either of these embodiments may be used in conjunction with any of the NAND string embodiments disclosed herein.

In the embodiment illustrated in FIG. 6A, a thin oxide barrier layer 152 is provided between each of the first material layers 3 and the second material layers 122. The oxide of the oxide layer 152 is selected to prevent out diffusion of the dopant from the first material layers 3 to the second material layers 122 when the first material layers 3 comprise doped polysilicon and the second material layers 122 comprise intrinsic polysilicon.

In the embodiment illustrated in FIG. 6B, the upper surfaces of the first material layers 3 and the second material layers 122 are doped with carbon to form a thin carbon doped barrier layer 154. The doped carbon surface reduces or eliminates dopant diffusion from the first material layers 3 to the second material layers 122 in a manner similar to the thin oxide layer 152 in the embodiment illustrated in FIG. 6A.

FIGS. 7A to 7C are side cross sectional views of illustrating an alternative method of making a NAND string.

In this embodiment, the steps illustrated in FIGS. 5A-5E may be performed as discussed above. However, rather than partially fill the back side recesses 64 with the insulating material 19, the back side recesses 64 are completely filled with the insulating material 19 as illustrated in FIG. 7A.

Next, as illustrated in FIG. 7B, the first material layers 3 are selectively recessed to form back side recesses 64' between adjacent layers of insulating material 19. A second portion 3" of the first material layers 3 is left in the back side recesses 64'.

Then, as illustrated in FIG. 7C, a metal and/or metal nitride material is deposited in the back side recesses 64' to form the first metal and/or metal nitride portion 3'" of the control gate electrodes. The metal or metal nitride may comprise, but is not limited to, Ti, W, Ta, TiN, WN or TaN. Thus, the embodiment includes selectively recessing the first material layers 3 to form second back side recesses 64' between adjacent interlayer insulating layers 19 and filling the second back side recesses 64' with at least one of a metal or metal nitride control gate electrode material through the back side opening (e.g. trench) 84 to form control gate electrodes having at least one of metal and metal nitride back portions 3'" and doped silicon front portions 3". The methods of FIGS. 5A-5I and 7A-7C form control gates between the interlayer insulating layers 19, each control gate electrode comprises a front polysilicon portion 3" and a back metal, metal silicide or metal nitride portion 3' or 3'" which is located farther from the semiconductor channel than the front portion 3".

FIGS. 8A-8F are side cross sectional views of illustrating a method of making back side openings, such as slit trenches, for a NAND device according to an embodiment.

In this embodiment, the steps illustrated in FIGS. 5A-5C may be performed as discussed above, where the front side openings 81 are formed by MILE or another etching method. As illustrated in FIG. 8A, a sacrificial layer 130 is deposited on the stack rather than the cover layer 146. Similar to the embodiments above, the sacrificial layer 130 may be made of any suitable material that may be used as an etch mask, such as a hard mask material, for example silicon nitride.

Next, as illustrated in FIG. 8B, the sacrificial layer 130 is patterned to form at least one opening 132 in the sacrificial layer 130 to expose a top layer of the stack 120. The sacrificial layer 130 may be patterned by any suitable method, such as reactive ion etching.

Then, as illustrated in FIG. 8C and similar to FIG. 4C, a metal layer 134 is deposited over the sacrificial layer 130 and in the openings 132 in the sacrificial layer 130 to form a metal block 136 (e.g. plug) in the openings 132 in the sacrificial layer 130. As in the previous embodiments, the metal layer 134 is made of any metal that catalyzes etching of the first and second material layers 3, 122.

Next, as illustrated in FIG. 8D, one or more back side openings 84, such as slit trenches, are formed using the MILE process in which the metal blocks act as a catalyst. In an embodiment, first material layers 3 comprise doped polysilicon, the second material layers 122 comprises intrinsic polysilicon and the back side openings are formed by wet etching with an aqueous mixture of $H_2O_2$ and HF.

Then, as illustrated in FIG. 8E, the metal blocks 136 are removed from the back side opening 84 and the sacrificial layer 130 is removed from the top of the stack 120. Next, as illustrated in FIG. 8F, the second material layers 122 are selectively removed and replaced through the back side opening 84 with an insulating material 19, such as silicon oxide.

FIGS. 9A-9F are side cross sectional views of illustrating a method of making support pillars for a NAND string device according to an embodiment.

Similar to the previous embodiment, the steps illustrated in FIGS. 5A-5C may be performed as discussed above. As illustrated in FIG. 9A, and similar to FIG. 8A, a sacrificial layer 130 is deposited on the stack 120. Further, as illustrated in FIGS. 9A, 11A, 11B the support pillar locations are located in a terraced word line region 280 remote from active region 182 containing the NAND strings 180. Similar to the embodiments described above, the sacrificial layer 130 is patterned to form openings 132 that expose the top layer of the stack 120.

Then, as illustrated in FIG. 9B, a metal layer 134 is deposited over the sacrificial layer 130 and in the openings 132 in the sacrificial layer 130 to form metal blocks 136 in the openings 132 in the sacrificial layer 130. As in the previous embodiments, the metal may be any metal that catalyzes the etching of the first and second material layers 3, 122.

Next, as illustrated in FIG. 9C, support pillar holes 104 are formed in the stack 120 by etching the first and second material layers 3, 122 using the MILE process in which the metal blocks 136 act as a catalyst. As in the previous embodiments, etching may be accomplished with wet etching in an aqueous solution comprising $H_2O_2$ and HF. Etching progresses until the etch stop 140 is reached.

Then, as illustrated in FIG. 9D, the metal blocks 136 are removed from the bottom of the support pillar holes 104, thereby exposing a portion of the etch stop 140 in the at least one opening 104. A method according to an embodiment includes removing the exposed portion of the etch stop 140 in the at least one opening 104.

Next, as illustrated in FIG. 9E, support columns 114 are formed in the support pillar holes 104. The support columns 114 may be made of any suitable material, such as an insulating material, e.g. $SiO_2$, silicon nitride etc. or a metal core surrounded by an insulating shell.

Then, as illustrated in FIG. 9F, the entire memory device (i.e., the terrace region 280 and the NAND string 180) may be covered with a cover layer 146.

FIGS. 10A and 10B are plan views illustrating different memory hole 81 and/or support hole 104 shapes that may be made according to embodiments. As illustrated in FIG. 10A, circular openings 81 may be fabricated. Generally square shaped openings 81 may also be fabricated, as illustrated in FIG. 10B. Other shapes, such as ovals and hexagons may also be made. Further, rectangular openings may be fabricated, such as slit trenches for the back side openings 84. In alternative embodiments, the MILE method discussed above may be used to make trench shaped memory openings 81.

FIGS. 11A and 11B are plan views illustrating embodiments of NAND string memory devices. In the embodiment illustrated in FIG. 11A, a back side opening (slit trench) 84 is provided every four rows of NAND strings 180. In the embodiment illustrated in FIG. 11B, a back side opening (slit trench) 84 is provided every two rows of NAND strings 180. In the embodiments illustrated in both FIGS. 11A and 11B, an insulator is formed on the sidewalls in the back side openings 84. Additionally, source lines are formed in the back side openings 84. The source lines in the back side openings 84 contact source regions in the substrate.

Embodiments include NAND devices made by any of the methods discussed above. In an embodiment, the NAND device includes strings that contain more than 60 device levels. E.g. 62-200, such as 64-128 levels and wherein the semiconductor channel has substantially vertical sidewalls (e.g. which deviate by less than 5° from vertical direction) and a substantially uniform cross section (e.g. less than 10% variation in mean diameter along the vertical direction) when viewed from the top. In an embodiment, the substrate is silicon and the silicon substrate contains an integrated circuit comprising a driver circuit for the memory device located thereon.

In another embodiment, the method of making a monolithic three dimensional NAND device includes selectively removing at least portions of the first material layers 3 through the front side opening 81 to form front side recesses 62 between adjacent second material layers 122, as shown in FIG. 5A. The method also includes depositing polysilicon floating gates 9 in the front side recesses 81 and forming a tunnel dielectric 11 over the floating gates 3 in the front side opening 81 to form a portion of a memory film, similar to that shown in FIG. 5B, except that the blocking dielectric 7 of FIG. 5B may be omitted at this step. The method also includes forming the semiconductor channel material 1 over the tunnel dielectric 11 in the front side opening 81, as shown in FIG. 5C. The method also includes forming a back side trench 84 through the stack 120 using a MILE step or another etching process, and selectively removing the first material layers 3 through the back side trench 84 to form first back side recesses 64' between adjacent stack layers (e.g., 112 or 19), similar to that shown in FIG. 7B. Since the blocking dielectric 7 is omitted, this etching step exposes the floating gates 9 in the back side recesses 64'.

The method also includes forming a metal or metal nitride layer (e.g., similar to layer 70 shown in FIG. 5G) through the back side trench 84 in the back side recesses 64' in contact with the floating gates 9. The method further includes forming a blocking dielectric 7 through the back side trench 84 in the back side recesses 64' and forming control gate electrodes 3 through the back side trench 84 in the back side recesses 64' in contact with the blocking dielectric 7, as shown in FIG. 12.

Figure 12:
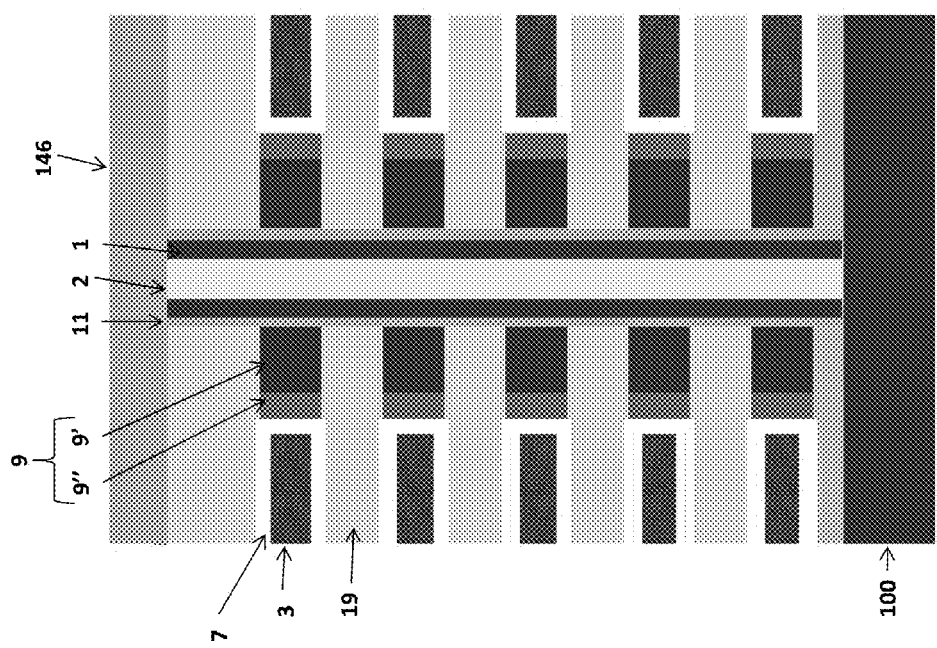
FIG. 12 is a side cross sectional view of another embodiment NAND string.

In one embodiment, the floating gates 9 comprise a polysilicon front portion 9' and a metal or metal nitride (e.g. tantalum nitride) back portion 9", as shown in FIG. 12. In another embodiment, the method includes reacting a metal layer with the polysilicon floating gates 9 to form floating gates comprising a metal silicide 9''' or a combination of a metal silicide back portion 9''' and a polysilicon front portion 9'.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A method of making a monolithic three dimensional NAND device, comprising:
    forming a stack of alternating layers of a first material and a second material different from the first material over a substrate;
    forming a mask layer over the stack;
    patterning the mask layer to form at least on opening in the mask layer to expose a top layer of the stack;
    forming a metal block in the at least one opening in the mask layer;
    etching the stack by metal induced localized etch using the metal block in the at least one opening in the mask layer to form at least one opening in the stack; and forming at least one layer of the NAND device in the at least one opening.

2. The method of claim 1, further comprising removing the metal block from a bottom of the at least one opening in the stack and removing the mask layer from the stack prior to the step of forming at least one layer of the NAND device.

3. The method of claim 1, wherein the first material comprises doped polysilicon and the second material comprises intrinsic polysilicon.

4. The method of claim 3, wherein:
the step of etching the stack comprises providing a solution comprising hydrogen peroxide and hydrofluoric acid to the metal block in the at least one opening in the mask layer;
the hydrogen peroxide oxidizes a surface of the doped or intrinsic polysilicon layer below the metal block to form a silicon oxide region below the metal block;
the hydrofluoric acid etches the silicon oxide region causing the metal block to sink into the stack; and
the silicon oxide region formation, silicon oxide region etching and metal block sinking into the stack are repeated a plurality of times to form the opening.

5. The method of claim 1, wherein the at least one opening has substantially vertical sidewalls and a substantially uniform cross section when viewed from the top.

6. The method of claim 5, wherein the substantially uniform cross section comprises a substantially uniform circular, oval or rectangular cross section.

7. The method of claim 1, wherein the at least one opening in the stack comprises at least one of a front side opening, a back side trench, or a support pillar opening.

8. The method of claim 7, wherein forming the at least one opening in the stack comprises forming the at least one front side opening in the stack, and forming at least one layer of the NAND device in the at least one opening comprises forming at least a portion of a memory film and a semiconductor channel in the front side opening.

9. The method of claim 8, further comprising:
selectively removing portions of the first material layers through the front side opening to form front side recesses between adjacent second material layers;
depositing a blocking dielectric in the at least one front side opening and in the front side recesses, wherein the blocking dielectric comprises a plurality of metal oxide clam shaped regions in the front side recesses;
forming charge storage regions over the blocking dielectric in the front side recesses;
forming a tunnel dielectric over the charge storage regions in the front side opening to form the memory film; and
forming the semiconductor channel material over the tunnel dielectric in the front side opening.

10. The method of claim 9, further comprising:
forming the back side trench through the stack using a second metal induced localized etch step;
selectively removing the second material layers through the back side trench to form first back side recesses between adjacent first material layers and to expose the first material layers in the back side recesses;
at least partially filling the first back side recesses with an insulating material to form interlayer insulating layers in the respective first back side recesses; and
forming the control gate electrodes between the interlayer insulating layers.

11. The method of claim 10, wherein:
the first material layers comprise doped silicon layers;
at least partially filling the first back side recesses with an insulating material comprises partially filling the first back side recesses to form interlayer insulating layers that partially fill the respective first back side recesses; and
forming the control gate electrodes between the interlayer insulating layers comprises:
forming a metal layer in the back side trench and in the first back side recesses in contact with sidewalls of the first material layers exposed in the back side trench and in the first back side recesses in contact with back portions of horizontal surfaces of the first material layers exposed in the first back side recesses;
reacting the metal layer with the first material layers to transform back portions of the first material layers into a metal silicide, wherein front portions of the first material layers located between the interlayer insulating layers remain as doped silicon layers to form control gate electrodes having silicide back portions and doped silicon front portions; and
filling remaining portions of the first back side recesses with an insulating material.

12. The method of claim 10, wherein:
the first material layers comprise doped silicon layers;
at least partially filling the first back side recesses with an insulating material comprises completely filling the first back side recesses to form interlayer insulating layers that completely fill the respective first back side recesses; and
forming the control gate electrodes between the interlayer insulating layers comprises:
selectively recessing the first material layers to form second back side recesses between adjacent interlayer insulating layers; and
filling the second back side recesses with at least one of a metal or metal nitride control gate electrode material through the back side trench to form control gate electrodes having at least one of metal and metal nitride back portions and doped silicon front portions.

13. The method of claim 8, further comprising:
selectively removing at least portions of the first material layers through the front side opening to form front side recesses between adjacent second material layers;
depositing polysilicon floating gates in the front side recesses;
forming a tunnel dielectric over the floating gates in the front side opening to form a portion of the memory film;
forming the semiconductor channel material over the tunnel dielectric in the front side opening;
forming the back side trench through the stack using a second metal induced localized etch step;
selectively removing the first material layers through the back side trench to form first back side recesses between adjacent second material layers and to expose the floating gates in the back side recesses;
forming a metal or metal nitride layer through the back side trench in the back side recesses in contact with the floating gates;
forming a blocking dielectric through the back side trench in the back side recesses; and
forming control gate electrodes through the back side trench in the back side recesses in contact with the blocking dielectric.

14. The method of claim 13, wherein the floating gates comprise a polysilicon front portion and a tantalum nitride back portion.

15. The method of claim 13, further comprising reacting the metal layer with the polysilicon floating gates to form insulating floating gates comprising a metal silicide.

16. The method of claim 1, further comprising:
   forming an etch stop over the substrate prior to forming the stack;
   removing the mask layer from the stack;
   removing the metal block from a bottom of the at least one opening in the stack, thereby exposing a portion of the etch stop in the at least one opening; and
   removing the exposed portion of the etch stop in the at least one opening.

17. The method of claim 3, further comprising forming barrier layers between adjacent layers of the first material and the second material, the barrier layers comprising an oxide or carbon material that decreases or prevents dopant diffusion between the layers of the first material and the second material.

18. A method of making a monolithic three dimensional NAND device, comprising:
   forming a stack of alternating layers of a first polysilicon material and a second material different from the first polysilicon material over a substrate, wherein the first polysilicon material layers comprise doped polysilicon layers;
   forming the at least one front side opening in the stack;
   forming at least a portion of a memory film and a semiconductor channel in the front side opening;
   forming a back side trench through the stack;
   selectively removing the second material layers through the back side trench to form first back side recesses between adjacent first polysilicon material layers and to expose the first polysilicon material layers in the back side recesses;
   at least partially filling the first back side recesses with an insulating material to form interlayer insulating layers in the respective first back side recesses, wherein at least partially filling the first back side recesses with an insulating material comprises partially filling the first back side recesses to form interlayer insulating layers that partially fill the respective first back side recesses; and
   forming control gate electrodes between the interlayer insulating layers, each control gate electrode comprising a front polysilicon portion and a back metal, metal silicide or metal nitride portion which is located farther from the semiconductor channel than the front portion, wherein forming the control gate electrodes between the interlayer insulating layers comprises:
      forming a metal layer in the back side trench and in the first back side recesses in contact with sidewalls of the first polysilicon material layers exposed in the back side trench and in the first back side recesses in contact with back portions of horizontal surfaces of the first polysilicon material layers exposed in the first back side recesses;
      reacting the metal layer with the first polysilicon material layers to transform back portions of the first polysilicon material layers into a metal silicide, wherein front portions of the first polysilicon material layers located between the interlayer insulating layers remain as doped polysilicon layers to form control gate electrodes having silicide back portions and doped polysilicon front portions; and
   filling remaining portions of the first back side recesses with an insulating material.

19. The method of claim 18, wherein the first polysilicon material layers comprise doped polysilicon layers, the second material layers comprise undoped polysilicon layers, and the front side opening and the back side trench are formed by separate metal induced localized etch steps.

* * * * *